United States Patent [19]

Edwards et al.

[11] 4,012,769
[45] Mar. 15, 1977

[54] HEAT SINK WITH PARALLEL FLAT FACES

[75] Inventors: Steven F. Edwards; James D. Pritchett, both of Dallas, Tex.

[73] Assignee: Thermalloy Incorporated, Dallas, Tex.

[22] Filed: Aug. 4, 1975

[21] Appl. No.: 601,920

[52] U.S. Cl. .................................. 357/81; 357/72; 165/80; 174/16 HS

[51] Int. Cl.² .................. H01L 23/02; H01L 23/28; E28F 7/00; H01B 7/24

[58] Field of Search ................. 357/81, 72; 165/80, 165/105; 174/16 HS

[56] References Cited

UNITED STATES PATENTS

| | | | |
|---|---|---|---|
| 3,222,580 | 12/1965 | Curll | 357/81 |
| 3,548,927 | 12/1970 | Spurling | 357/81 |
| 3,572,428 | 3/1971 | Monaco | 357/81 |
| 3,670,215 | 6/1972 | Wilkens et al. | 357/81 |
| 3,694,703 | 9/1972 | Wilens et al. | 357/81 |
| 3,893,161 | 7/1975 | Pesak | 357/81 |

OTHER PUBLICATIONS

Wakefield Semiconductor Heat Sinks and Thermal Products Distributor Products Catalog No. 102 Copyright 1970.

*Primary Examiner*—Andrew J. James
*Attorney, Agent, or Firm*—Jack A. Kanz

[57] ABSTRACT

Disclosed is a unitary heat sink apparatus for dissipating thermal energy generated by semiconductor devices encapsulated in an encapsulation device of the JEDEC TO-202 or Motorola Case 152 device case style. The heat sink is a unitary sheet metal device folded to form two opposed end plates joined by a central barrel portion which acts as a spring to urge the opposed faces of the end plates together. The thermal conductor tab extending from the encapsulation device is held between the opposed faces of the end plates.

7 Claims, 6 Drawing Figures

HEAT SINK WITH PARALLEL FLAT FACES

This invention relates to apparatus for dissipation of thermal energy generated by semiconductor devices. More particularly, it relates to heat sink apparatus designed to mount directly onto specialized semiconductor encasement structures and packages and dissipate thermal energy generated by such devices into the surrounding environment.

Many semiconductor devices generate heat during operation which must be dissipated to avoid damage to the device. In some devices the heat generated is dissipated sufficiently by the enclosure, header or leads. Other devices may be mounted on heat sinks comprising bodies of thermally conductive materials such as copper, aluminum or the like which dissipate the heat generated by the devices into the surrounding environment. Such heat sinks may be extruded or sheet metal bodies including heat dissipating fins or the like. Some semiconductor encapsulation devices are provided with a metal tab extending from the encapsulation body for conducting thermal energy from the active device body. Such devices are designed for use in connection with external heat dissipators to be connected to the thermally conductive tab. Accordingly, the heat conductive tab is usually a broadened tab and provided with means, such as a hole or the like, for attaching the tab to a thermal energy dissipation device, the dimensions and characteristics of which are determined by the use and environment of the semiconductor device.

Encapsulation devices typical of the type just described are the JEDEC TO-202 and Motorola Case 152 device case styles. These packages are comprised of a semiconductor device encapsulated in a plastic body with leads extending from one end of the package and a broad flat thermal conductor extending from the opposite end of the package. The broad thermal conductor tab usually has a hole therethrough to permit attachment of the thermal conductor to appropriate thermal energy dissipating apparatus.

The apparatus of this invention is particularly designed to be used in connection with a package of the JEDEC TO-202 and Motorola Case 152 device case styles. The invention is, however, equally applicable for use in connection with other case styles of similar design. The heat sink apparatus of the invention comprises a body of thermally conductive material such as an aluminum alloy or the like which, in its pre-formed condition, is a substantially rectangular flat plate of sheet metal. The midsection of the flat plate is formed into a cylinder or barrel and the ends of the rectangular portion folded parallel to extend radially from the cylinder. The end portions are flat and the opposed faces thereof are urged together by the spring action of the cylindrical body. Notches are formed in registry in the ends of the opposed end sections and the bases of the notches are flared outwardly. The thermal conductor tab of the device may be inserted between the opposed end plates and the thermal conductor tab is thus rigidly held between the end plates by the spring action of the cylindrical portion. This configuration provides positive retention of the device within the heat sink and maximum contact area between the thermal conductor tab and the heat sink. Thermal energy conducted through the thermal conductor tab to the heat sink is dissipated by natural or forced air convection through and around the heat sink device.

The heat sink apparatus of the invention is particularly advantageous in that the apparatus is completely unitary and no mounting hardware is required. The device simply clips onto the thermal conductor tab extending from the encasement device. Because of the configuration of the notches in the heat sink and the spring action of the cylindrical barrel, the heat sink is firmly attached to the semiconductor device and provides maximum thermal conduction from the semiconductor device and dissipation of energy into the surrounding atmosphere. Other advantages and features of the invention become readily understood when taken in connection with the appended claims and attached drawings in which:

Figure 1:
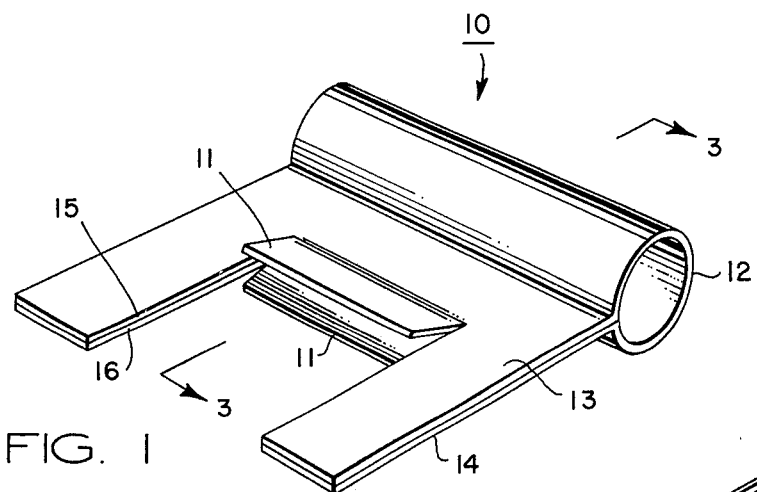
FIG. 1 is a perspective view of the preferred embodiment of the invention.

The preferred embodiment of the heat sink of the invention is illustrated in perspective in FIG. 1. The device is comprised of body 10 of thermally conductive material, preferably aluminum or aluminum alloy, which may be anodized, plated, or unfinished. The body 10 may be, for example, a rectangular plate of sheet metal which may be worked by conventional methods to form the desired shape. The ends of the rectangular plate are symmetrically cut to form notches 15 and 16. In cutting the notches the longitudinal cuts are extended past the base of the notch a short distance so that the base of the notch may be flared outwardly to form a flared tab 11. As illustrated in FIG. 1, the central portion of the body 10 is rolled to form a cylinder or barrel 12 with end plates 13 and 14 parallel and extending radially from the barrel 12. By forming the central portion into a barrel or cylinder 12, the end plates 13 and 14 are urged together and the symmetrical notches are placed in registry. It will be observed that the flared tabs 11 are flared in opposite directions so that substantially the entire opposed surfaces of the parallel end plates 13 and 14 may be urged into mutual contact. The flared tabs 11 are flared outwardly about 10° to provide for easy insertion of the thermal conductor tab 17 of the encapsulation device.

Figure 3:
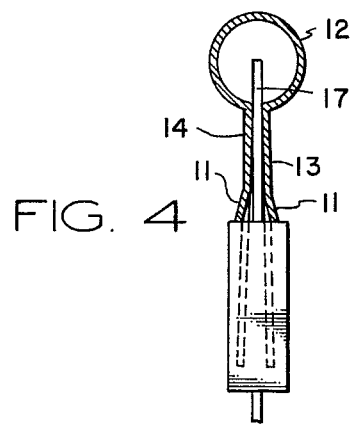
FIG. 3 is a sectional view of the device illustrated in FIG. 1 taken through section lines 3—3.

The finished device of FIG. 1 is shown in section in FIG. 3. As shown in FIGS. 1 and 3 the faces of the end plates 13 and 14 are in mutual contact and the legs 13 and 14 defining the notches are also in mutual contact.

Figure 2:
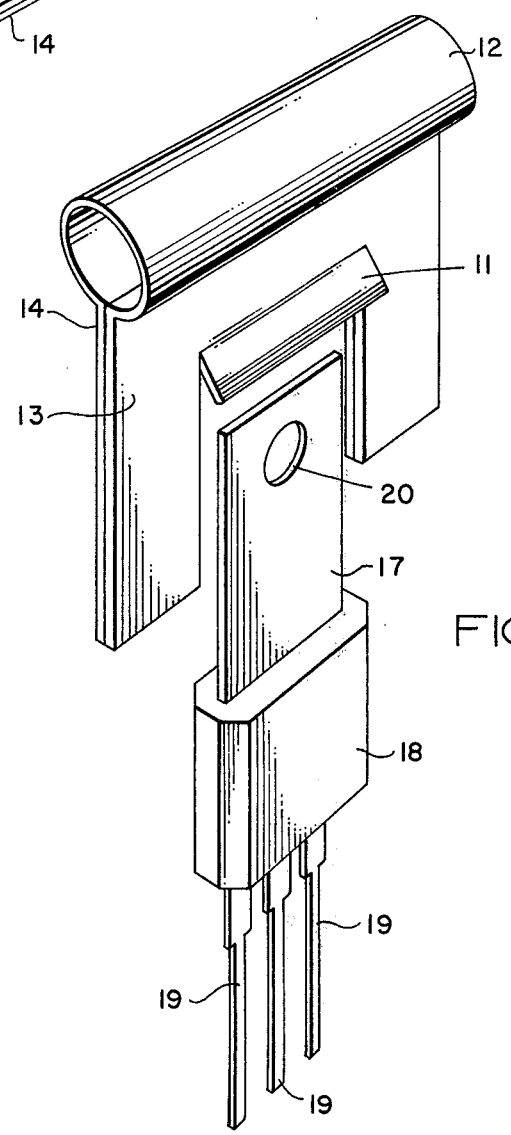
FIG. 2 is an assembly drawing illustrating the manner in which the semiconductor device is inserted within the heat sink of the invention.
Figure 4:
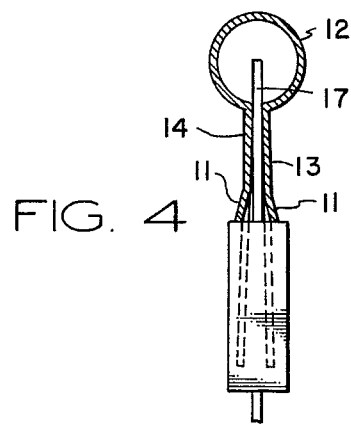
FIG. 4 is a sectional view of the combination of the semi-conductor device and heat sink of FIG. 2 in the assembled condition.

Assembly of the heat sink and a semiconductor device is illustrated in FIG. 2. The semiconductor device in a package of the JEDEC TO-202, Motorola Case 152 or other similar case style generally comprises a plastic encapsulation body 18 having leads 19 extending from one end thereof and a thermal conductor tab 17 extending from the opposite end thereof. The heat conducting tab 17 is generally a broad flat thermally conductive tab which may have a hole 20 therein. The tab 17 is inserted between the flared tabs 11 and pushed between the opposed surfaces of end plates 13 and 14 as illustrated in FIG. 4. It will be observed that the tab 17 may be pushed between the plates 13 and 14 until the flared tabs 11 contact the end of the plastic encapsulation body 18. The tab 17 will thus usually extend into the barrel of the heat sink and the opposed end plates 13 and 14 contact a major portion of the tab 17. It will be observed that because of the configuration of the apparatus of the heat sink apparatus 10, the end plates 13 and 14 are urged to intimate contact with the heat conducting tab 17, thus providing a broad contact surface for efficient thermal transfer between the tab 17 and the end plates 13 and 14. It will further be observed that as the tab 17 is inserted between the plates 13 and 14, the legs 15 and 16 extend parallel with the body 18 of the encapsulation device. Thus the legs 15 and 16 partially surround the encapsulation body 18 and prevent the heat sink body 10 from being accidentally misaligned or laterally removed from the semiconductor encapsulation device. Furthermore, by inserting the heat conducting tab 17 between the end plates 13 and 14 the legs 15 and 16 are spread apart and may act as fins extending into the surrounding environment to aid in the dissipation of thermal energy.

Thermal energy conducted from the semiconductor encapsulation body 18 through tab 17 is rapidly transferred to the heat sink body 10 by the broad area intimate contact between the tab 17 and the opposed end plates 13 and 14. Air may circulate through the cylinder 12 and around the legs 15 and 16 by natural convection to aid in the dissipation of thermal energy. Furthermore, the portion of tab 17 extending into the barrel 12 of the heat sink 10 is also exposed to air circulating through the barrel to further aid in dissipation of thermal energy.

It will be readily recognized by those skilled in the art that the barrel 12 need not be of cylindrical configuration. The two primary functions of the barrel 12 are to act as a spring urging the end plates 13 and 14 together and to act as heat radiator. Obviously various other geometric designs will lend themselves equally to the functions required. However, the apparatus as described is easily formed in a stamping operation by commercially available tools.

Figure 5:
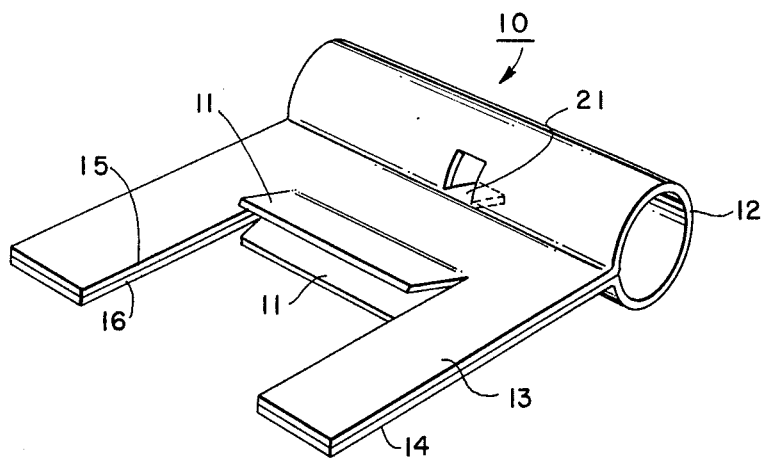
FIG. 5 is a perspective view of an alternate embodiment of the heat sink of the invention.
Figure 6:
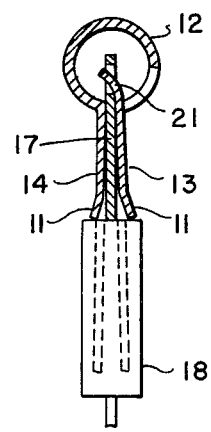
FIG. 6 is a sectional view of the embodiment of FIG. 5 illustrating the interconnection of the locking tab with the semiconductor device package.

In the alternative embodiment shown in FIGS. 5 and 6, a locking tab 21 is formed by cutting a flap from the portion of the cylinder 12 leaving the end of the flap 21 attached at the juncture of the end plate 13 and the barrel and slightly bending the flap into the cylinder. The tab 21 is positioned at approximately the longitudinal midsection of the cylinder 12 so that as the thermal conduction tab 17 of the semiconductor device is pushed between the end plates 13 and 14, the locking tab 21 will be aligned with and engage the hole 20 in the tab 17. When locking tab 21 is passed over the hole 20, the tab 21 extends into the hole 20 and thus serves to retain the heat sink on the thermal conduction tab 17.

It will be observed that the entire heat sink apparatus is of unitary design which may be formed by simple stamping operations. Assembly is accomplished by merely inserting the tab 17 between the opposed faces 13 and 14. Thus installation hardware is completely eliminated. Furthermore, time necessary to attach heat sinks to the semiconductor device is greatly reduced and installation tools are not required. The efficiency of the heat sink will be partially dependent, of course, upon the type of material used, the size and configuration of the heat sink body, the surrounding environment, the thermal energy generated by the device, and the area of contact between the heat sink and the heat conducting tab.

While the invention has been described with particular reference to a heat sink formed of a rectangular body of aluminum alloy, it will be apparent to those skilled in the art that the body need not be of rectangular dimensions. The principles of the invention will be served by any unitary body which may be formed to present opposed end plates overlying each other in mutual contact and urged together by the central portion of the body. Likewise, although the invention has been described with reference to use of aluminum alloy as the heat sink body, other materials may be used with similar results.

It is to be understood that although the invention has been described with particular reference to specific embodiments thereof, the forms of the invention shown and described in detail are to be taken as preferred embodiments of same, and that various changes and modifications may be resorted to without departing with the spirit and scope of the invention as defined by the appended claims.

What is claimed is:

1. Unitary heat sink apparatus comprising a substantially cylindrical body of thermally conductive material having a pair of mutually opposed substantially flat members extending radially outwardly from said cylindrical body, the opposed faces of said radially extending members being resiliently urged into mutual contact by the substantially cylindrical body, each of said opposed faces having a notch therein, said notches lying in register and defining an open-ended space for receiving the body of a semiconductor encapsulation device having a central body with leads extending from one end of said body and a thermal conductor tab extending from the opposite end of said body when said thermal conductor tab is grippingly held between said opposed faces, the sides of said flat members defining said notches extending along opposite sides of said central body to retain said central body within said notches and to act as fins extending into the surrounding environment, at least one of said flat members having the edge thereof at the base of said notch flared outwardly from the opposed flat member.

2. Apparatus as defined in claim 1 wherein the end of each of said flat members at the base of said notches is flared outwardly from the other.

3. Apparatus as defined in claim 1 including a tab extending from one of said flat members into the interior of said cylindrical body.

4. In combination, a semiconductor encapsulation device having a central body, leads extending from one end of said central body, and a thermal conductor tab extending from the opposite end of said central body; and unitary heat sink apparatus comprising a substantially cylindrical body of thermally conductive material having a pair of mutually opposed substantially flat members extending radially outwardly from said cylindrical body, the opposed faces of said radially extending members having a notch therein lying in register with the other notch, the opposed faces of the bases of said notches being adjacent opposite sides of said thermal conductor tab and being resiliently urged toward each other and into intimate contact with said thermal conductor tab by the said substantially cylindrical body, and the portions of said flat members surrounding said notches extending substantially parallel with each other and with said central body and on opposite sides thereof to retain said central body within said notches and to act as fins extending into the surrounding environment.

5. The combination set forth in claim 4 wherein the base of each of said notches is flared outwardly from said thermal conductor tab.

6. The combination set forth in claim 4 wherein said thermal conductor tab has a hole therein and said heat sink apparatus includes locking means for engaging said hole.

7. The combination set forth in claim 6 wherein said locking means comprises a tab cut from said cylindrical body and extending from one of said flat members into the cavity of said cylindrical body and mating with said hole.

* * * * *